United States Patent
Yang

(10) Patent No.: US 9,865,576 B1
(45) Date of Patent: Jan. 9, 2018

(54) SOLAR CELL HOLLOW CIRCUIT AND SOLAR CELL DISPLAY DEVICE

(71) Applicant: NEXPOWER TECHNOLOGY CORPORATION, Taichung (TW)

(72) Inventor: Ying-Jhe Yang, Taichung (TW)

(73) Assignee: NEXPOWER TECHNOLOGY CORPORATION, Taichung (TW)

(*) Notice: Subject to any disclaimer, the term of this patent is extended or adjusted under 35 U.S.C. 154(b) by 2 days.

(21) Appl. No.: 15/372,413

(22) Filed: Dec. 8, 2016

(30) Foreign Application Priority Data

Sep. 19, 2016 (TW) .............................. 105130188 A

(51) Int. Cl.
| | | |
|---|---|---|
| *H01L 29/06* | (2006.01) | |
| *H01L 25/16* | (2006.01) | |
| *H01L 31/0224* | (2006.01) | |
| *H01L 31/0216* | (2014.01) | |
| *H01L 31/02* | (2006.01) | |
| *H01L 27/142* | (2014.01) | |
| *H01L 25/04* | (2014.01) | |
| *H01L 31/028* | (2006.01) | |

(52) U.S. Cl.
CPC ...... *H01L 25/167* (2013.01); *H01L 31/02167* (2013.01); *H01L 31/022466* (2013.01); *H01L 25/047* (2013.01); *H01L 27/142* (2013.01); *H01L 31/02008* (2013.01); *H01L 31/0284* (2013.01); *H01L 31/022425* (2013.01)

(58) Field of Classification Search
CPC ............ H01L 25/167; H01L 31/02167; H01L 31/022466; H01L 31/0284; H01L 25/047; H01L 27/142; H01L 31/02008; H01L 31/022425
USPC .......................................................... 257/80
See application file for complete search history.

(56) References Cited

U.S. PATENT DOCUMENTS

| | | | | |
|---|---|---|---|---|
| 2011/0126895 A1* | 6/2011 | Uda | ................... | H01L 31/03921 136/255 |
| 2013/0146121 A1* | 6/2013 | Caimi | ............... | H01L 31/02327 136/246 |
| 2014/0182669 A1* | 7/2014 | Hayase | ................ | H01G 9/2077 136/255 |
| 2014/0223201 A1* | 8/2014 | Chew | .................... | G06F 1/1635 713/300 |

\* cited by examiner

*Primary Examiner* — Vu A Vu
(74) *Attorney, Agent, or Firm* — CKC & Partners Co., Ltd.

(57) ABSTRACT

A solar cell hollow circuit is provided. The solar cell hollow circuit includes a substrate, a first conductive layer, a photoelectric conversion layer and a second conductive layer. The first conductive layer is formed on the substrate. The photoelectric conversion layer is formed on the first conductive layer. The second conductive layer is formed on the photoelectric conversion layer. A hollow surround area is formed on the substrate by the first conductive layer, the photoelectric conversion layer and the second conductive layer. The hollow surround area defines an opening and a positive contact or a negative contact corresponding to the opening.

14 Claims, 15 Drawing Sheets

SOLAR CELL HOLLOW CIRCUIT AND SOLAR CELL DISPLAY DEVICE

RELATED APPLICATIONS

This application claims priority to Taiwan Application Serial Number 105130188, filed Sep. 19, 2016, which is herein incorporated by reference.

BACKGROUND

Technical Field

The present disclosure relates to a solar cell circuit and a display device, and more particularly to a solar cell hollow circuit and a solar cell display device.

Description of Related Art

Electrochemical battery such as Lithium ion battery or Nickel-Metal Hydride battery is commonly equipped on a display device for providing electricity. However, such kind of electrochemical battery is not suitable for long-time use due to its low electricity capacity. Although rechargeable batteries have been developed nowadays, its electricity capacities are also limited, and its multiple recharging cycles cause inconvenience on usage. Powerbanks are also developed for providing instant power supply. However, pre-charging is also required when using the powerbanks; moreover, an extra space is needed to carry the powerbanks, and the volume thereof is too large. Therefore, it is also inconvenient to use the powerbanks. For solving the low electricity capacity and the low endurance problems, a solar cell is integrated with the display device for providing a continuous electric power through converting the light energy of the sunlight or the indoor lighting.

The aforementioned solar cell basically includes a photoelectric conversion layer for converting light energy to electric energy, and two electrodes located on the top side and the bottom side of the photoelectric conversion layer respectively. When an incident light is absorbed and converted by the photoelectric layer, the electric energy is generated. An inner circuit is generated through the two electrodes on the top side and the bottom side of the photoelectric conversion layer, and the electricity can be supplied to the device that connected with the inner circuit. In an application scenario, multiple solar cells are connected in series to form a solar cell module. Referring to FIGS. 1-3. FIG. 1 shows a structure of a conventional solar cell module 100 including multiple series-connected solar cells; FIG. 2 is a section view of the solar cell module 100 of FIG. 1; FIG. 3 is a circuit diagram of the solar cell module 100 of FIG. 1. A positive electrode layer 102, a photoelectric conversion layer 103 and a negative electrode layer 104 are stacked on a substrate 101 in sequence. In order to form the large-scaled solar cell module 100, a first isolation area $I_1$, a second isolation area $I_2$ and a third isolation area $I_3$ are formed. The first isolation area $I_1$ is through the photoelectric conversion layer 103 and the negative electrode layer 104, the second isolation area $I_2$ is through the photoelectric conversion layer 103 and the third isolation area $I_3$ is through the positive electrode layer 102. In FIG. 3, an inner circuit S is formed through the first isolation area $I_1$, the second isolation area $I_2$ and the third isolation area $I_3$, and a negative contact 106 and a positive contact 107 located on a plane are formed through the soldered point 105. The negative contact 106 and a positive contact 107 can be used to connect with an outer circuit for extracting the electric energy converted by the photoelectric conversion layer 103.

In the aforementioned solar cell module 100, although a large light-absorption area can be formed by the solar cells connected in series, the fill factor is decreased with the increasing area thereby lowering the electricity extraction efficiency. Conventionally, a viewable area will be decreased when assembling the solar cell module 100 with a display device owing to the distinctly different structures therebetween. Therefore, it is difficult for developing a display device with both compact volume and large viewable area.

Accordingly, there is a need to develop a solar cell module that can provide sufficient electricity, has compact volume and can be highly integrated with the display device nowadays.

SUMMARY

According to one aspect of the present disclosure, a solar cell hollow circuit is provided. The solar cell hollow circuit includes a substrate, a first conductive layer, a photoelectric conversion layer and a second conductive layer. The first conductive layer is formed on the substrate. The photoelectric conversion layer is formed on the first conductive layer. The second conductive layer formed on the photoelectric conversion layer. Wherein a hollow surround area is formed on the substrate by the first conductive layer, the photoelectric conversion layer and the second conductive layer, the hollow surround area defines an opening, and the hollow surround area defines a positive contact or a negative contact corresponding to the opening.

According to another aspect of the present disclosure, a solar cell display device is provided. The solar cell display device includes a substrate, a first conductive layer, a photoelectric conversion layer, a second conductive layer and a display panel. The first conductive layer is formed on the substrate. The photoelectric conversion layer is formed on the first conductive layer. The second conductive layer is formed on the photoelectric conversion layer, wherein a hollow surround area is formed on the substrate by the first conductive layer, the photoelectric conversion layer and the second conductive layer, and the hollow surround area defines an opening in a central position of the substrate. The display panel is covered on the opening and displaying texts or images on a position corresponding to the opening.

BRIEF DESCRIPTION OF THE DRAWINGS

The present disclosure can be more fully understood by reading the following detailed description of the embodiment, with reference made to the accompanying drawings as follows.

DETAILED DESCRIPTION

It is a purpose of the present disclosure to provide a solar cell hollow circuit. The solar cell hollow circuit can be easily integrated with the display device nowadays. Furthermore, the solar cell display device with the solar cell hollow circuit has a large viewable area, and the layout of the positive contact and the negative contact of the solar cell hollow circuit has flexible and wide application types.

Figure 1:
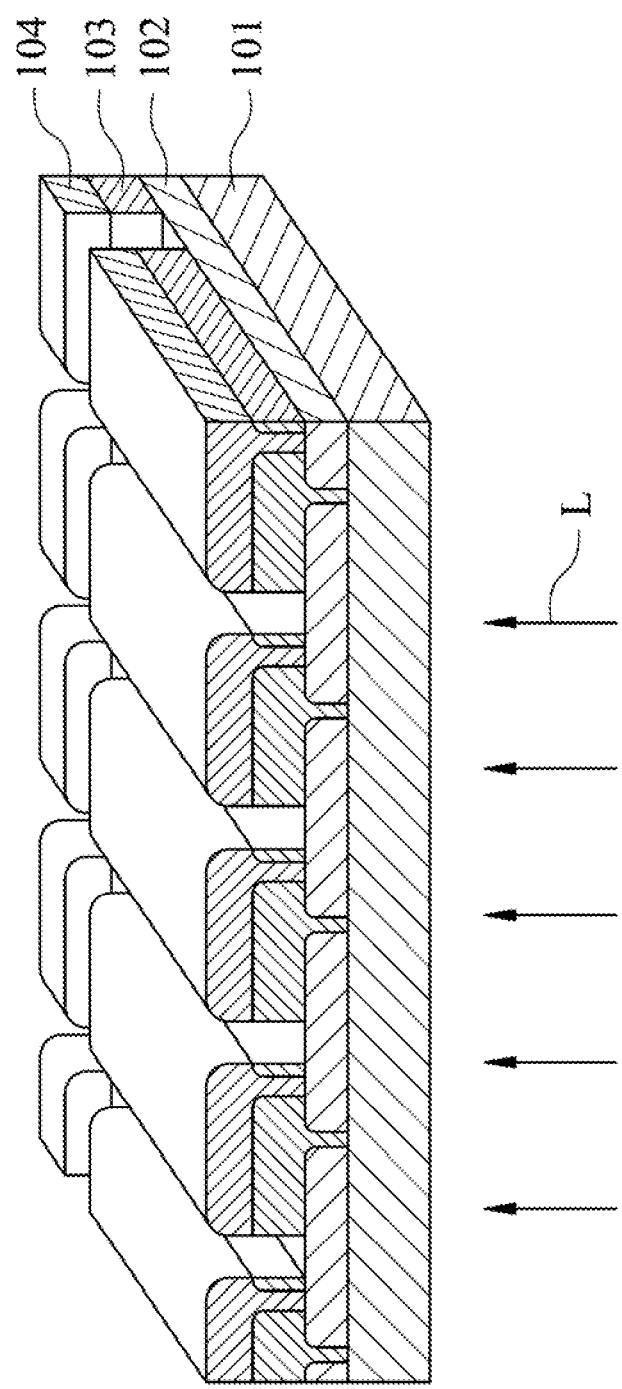
FIG. 1 shows a structure of a conventional solar cell module including multiple series-connected solar cells.
Figure 2:
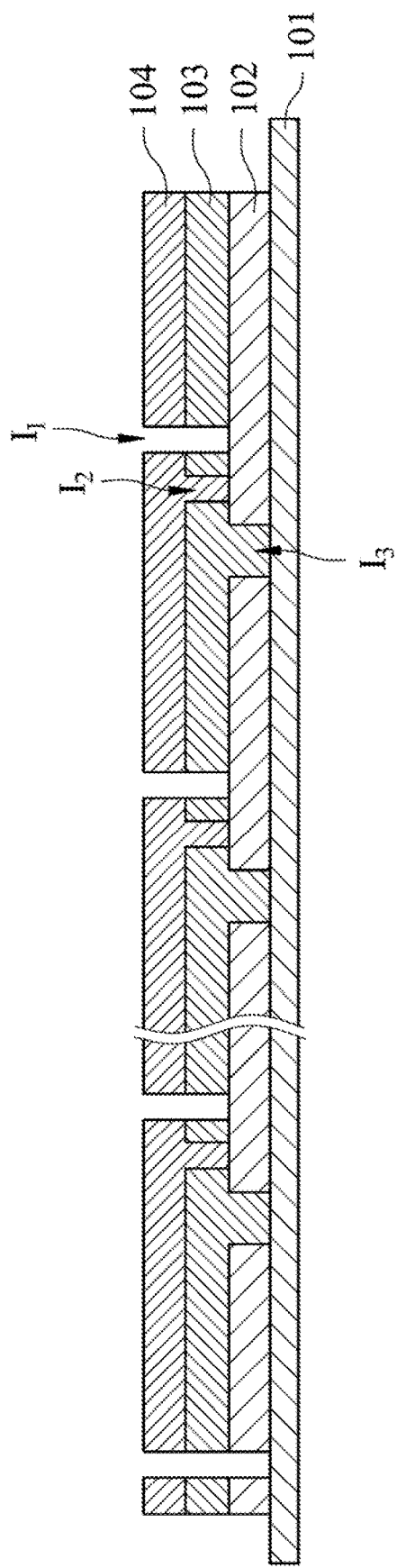
FIG. 2 is a section view of the solar cell module of FIG. 1.
Figure 3:
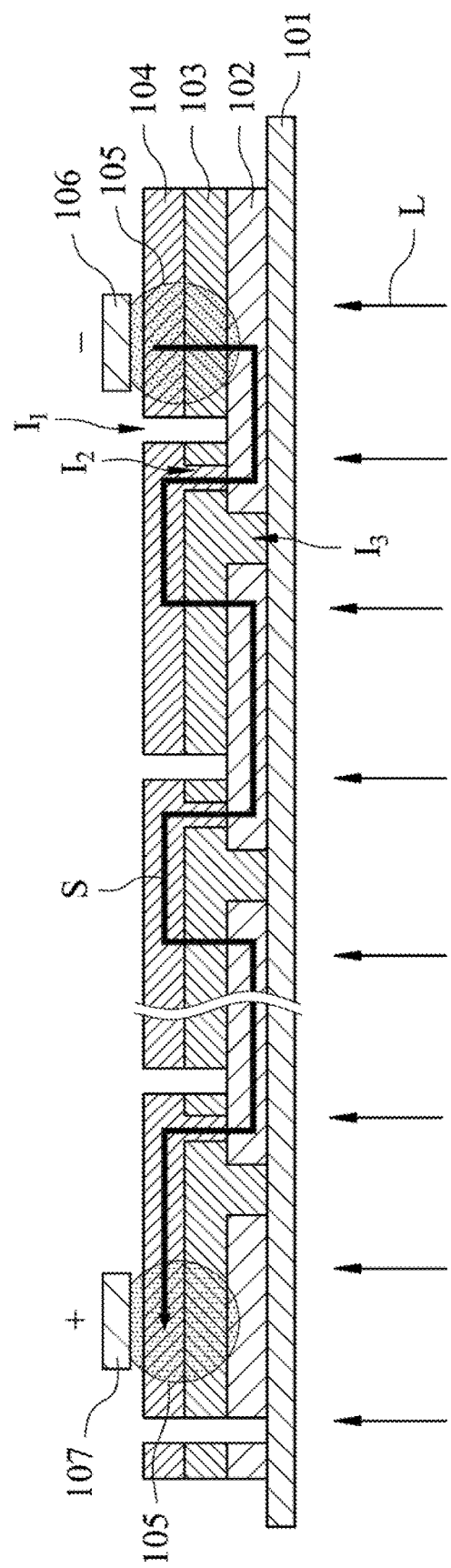
FIG. 3 is a circuit diagram of the solar cell module of FIG. 1.
Figure 4A:
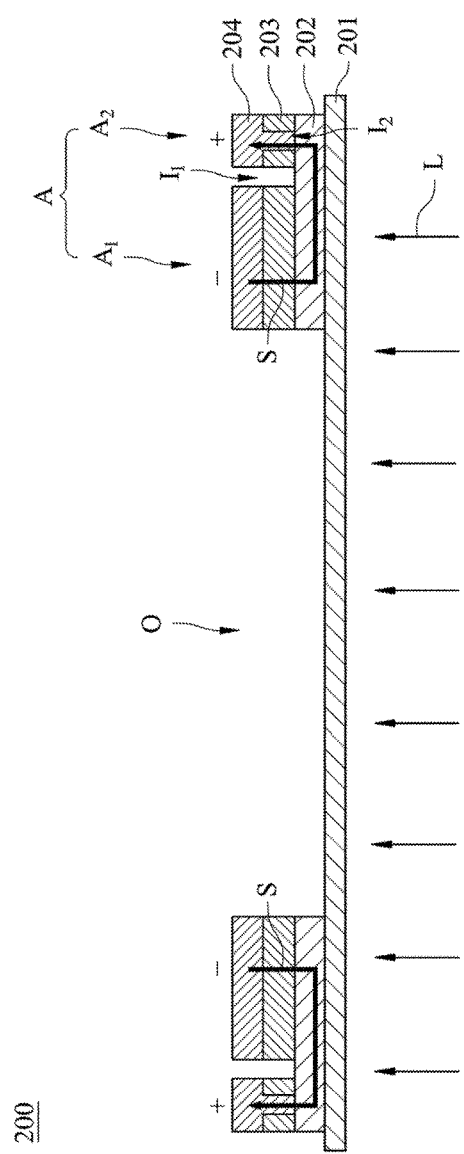
FIG. 4A is a section view showing a solar cell hollow circuit according to one embodiment of the present disclosure.
Figure 4B:
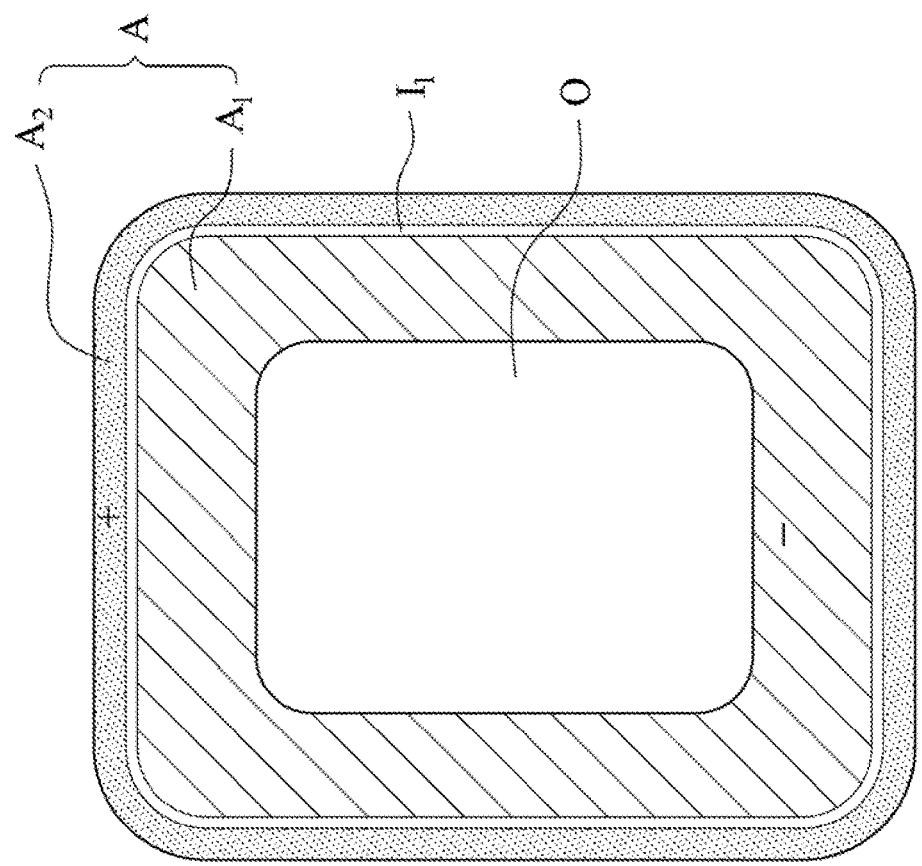
FIG. 4B is a top view of the solar cell hollow circuit of FIG. 4A.

FIG. 4A is a section view showing a solar cell hollow circuit 200 according to one embodiment of the present disclosure; FIG. 4B is a top view of the solar cell hollow circuit 200 of FIG. 4A. The solar cell hollow circuit 200 includes a substrate 201, a first conductive layer 202, a photoelectric conversion layer 203 and a second conductive layer 204. The first conductive layer 202 is formed on the substrate 201. The photoelectric conversion layer 203 is formed on the first conductive layer 202. The second conductive layer 204 is formed on the photoelectric conversion layer 203. A hollow surround area A is formed on the substrate 201 by the first conductive layer 202, the photoelectric conversion layer 203 and the second conductive layer 204. The hollow surround area A defines an opening O on a central position of the substrate 201. The hollow surround area A can be formed after forming the first conductive layer 202, the photoelectric conversion layer 203 or the second conductive layer 204; or can be formed after forming a first conductive layer 202/photoelectric conversion layer 203/second conductive layer 204 multiple layer structure.

The photoelectric conversion layer 203 is used to convert light energy to electric energy. The photoelectric conversion layer 203 is essentially a thin-film solar cell, the material of the photoelectric conversion layer 203 can be single crystal silicon, amorphous silicon (a-Si), micro-crystal silicon (uc-Si), amorphous Silicon-Germanium (a-SiGe), amorphous silicon oxide (a-SiO), amorphous silicon carbide (a-SiC), CuInGaSe, CdTe, DSSC or organic compound. The first conductive layer 201 and the second conductive layer 204 are used to extract the electric energy. In general, the material of the first conductive layer 202 can be a TCO, a metal or a combination thereof and the material of the second conductive layer 204 can be a TCO, a metal or a combination thereof.

For constructing a practicable circuit, a first isolation area $I_1$ is formed on the first conductive layer 202, and the first isolation area $I_1$ is through the photoelectric conversion layer 203 and the second conductive layer 204. A second isolation area $I_2$ is also formed on the conductive layer 202, the second isolation area $I_2$ is through the photoelectric conversion layer 203, and the second conductive layer 204 fills the second isolation area $I_2$.

The hollow surround area A is isolated by the first isolation area $I_1$ thereby forming a first surround area $A_1$ adjacent to the opening O and a second surround area $A_2$ away from the opening O. In FIGS. 4A and 4B, the first surround area $A_1$ acts a positive contact, and the second surround area $A_2$ acts a negative contact. The material of the first conductive layer 202 can be a TCO, a metal or a combination thereof and acts as the positive contact, and the material of the second conductive layer 204 can be a TCO, a metal or a combination thereof and acts as the negative contact. The first surround area $A_1$ is conducted with the second conductive layer 204, and the second surround area $A_2$ is conducted with the first conductive layer 202 owing to the formation of the first isolation area $I_1$ and the second isolation area $I_2$. When a light L is incident from the substrate 201 to the photoelectric conversion layer 203, the light energy is converted to the electric energy, and an inner circuit S is generated. At the time, the electric energy can be extracted by the negative contact formed form the first surround area $A_1$ and the positive contact formed from the second surround area $A_2$. In the present disclosure, the position of the positive contact and the negative contact can be changed in accordance with different structural arrangements. In some embodiments, the first surround area $A_1$ can act as the positive contact, and the second surround area $A_2$ acts as the negative contact. The various arrangements of the positive contact and the negative contact will be described in the following embodiments.

Figure 5A:
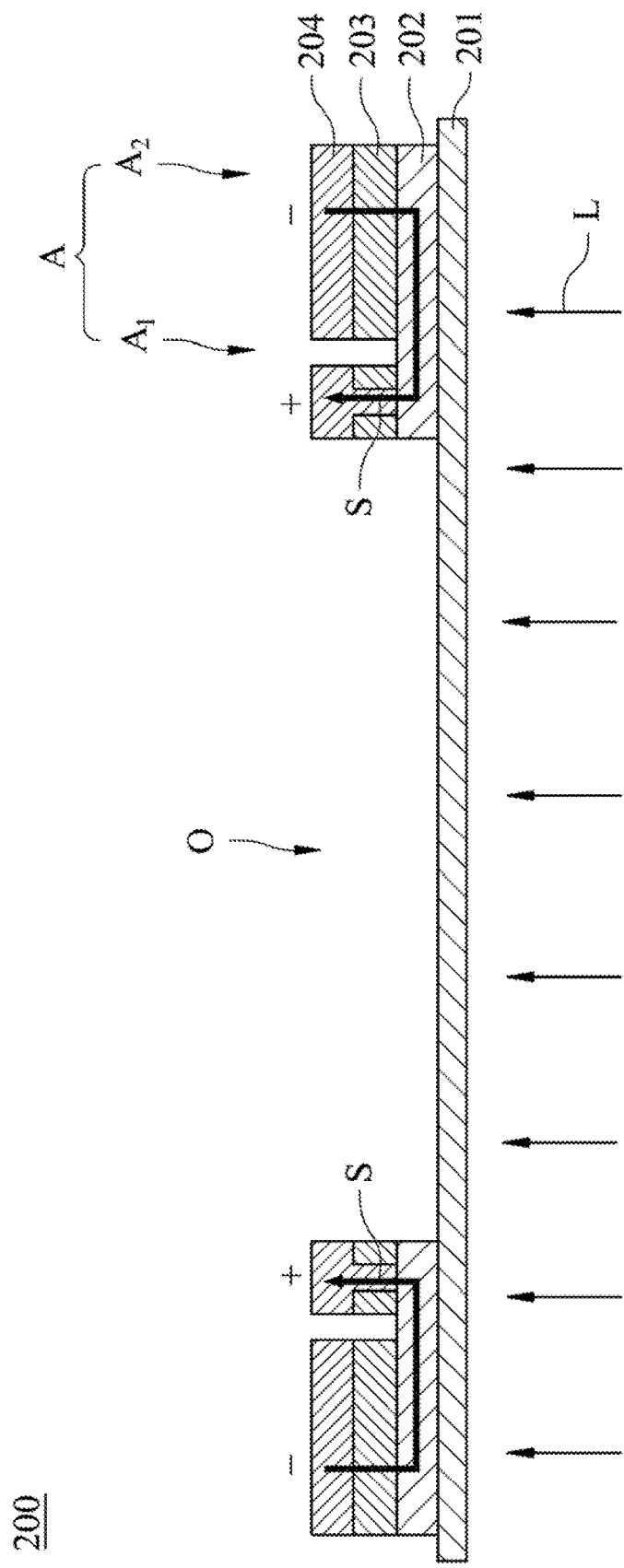
FIG. 5A is a section view showing a solar cell hollow circuit according to one embodiment of the present disclosure.
Figure 5B:
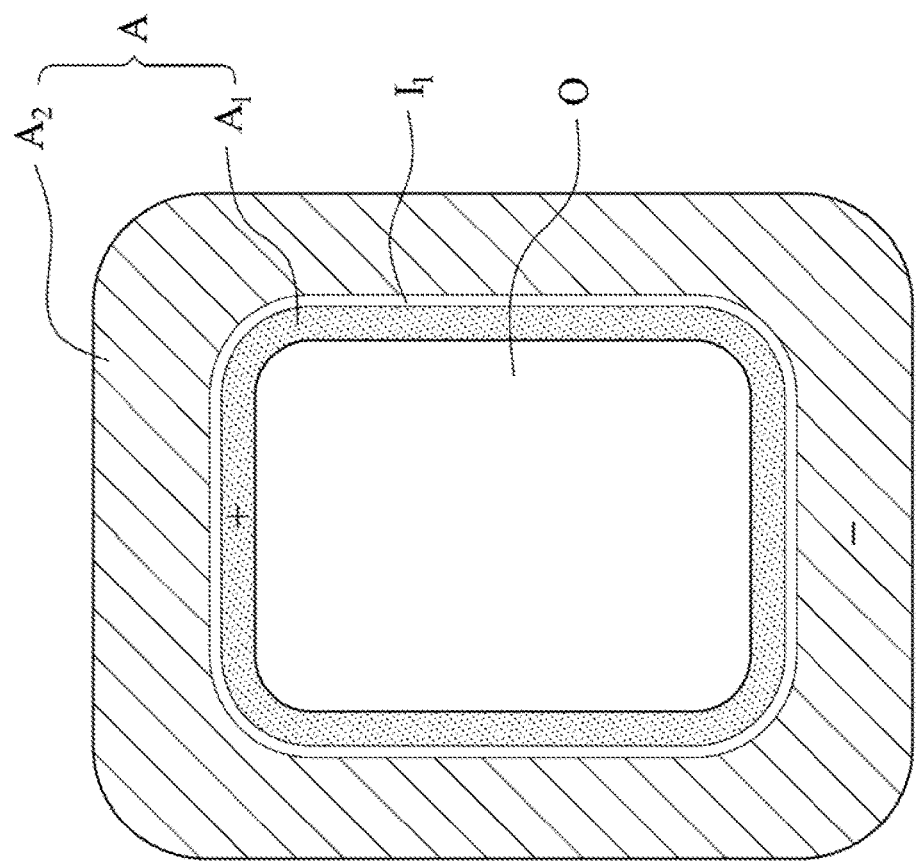
FIG. 5B is a top view of the solar cell hollow circuit FIG. 5A.

FIG. 5A is a section view showing a solar cell hollow circuit 200 according to one embodiment of the present disclosure; FIG. 5B is a top view of the solar cell hollow circuit 200 of FIG. 5A. The solar cell hollow circuits 200 in FIGS. 5A and 5B have similar structure with those in FIGS. 4A and 4B, but the positions of the first isolation area $I_1$ and the second isolation $I_2$ are different. In FIG. 5A, owing to the different positions of the first isolation area $I_1$ and the second isolation $I_2$, the first surround area $A_1$ is conducted with the first conductive layer 202, and the second surround area $A_2$ is conducted with the second conductive layer 204, thereby causing a reverse direction of the inner circuit S in FIG. 4A. At the time, the first surround area $A_1$ adjacent to the opening O acts the positive contact and the second surround area $A_2$ away from the opening O acts the negative contact. The different arrangements of the positive contact and the negative contact are also shown in FIG. 5B.

The solar cell hollow circuit 200 can form series circuits on the hollow surround area A for various applications.

Figure 6A:
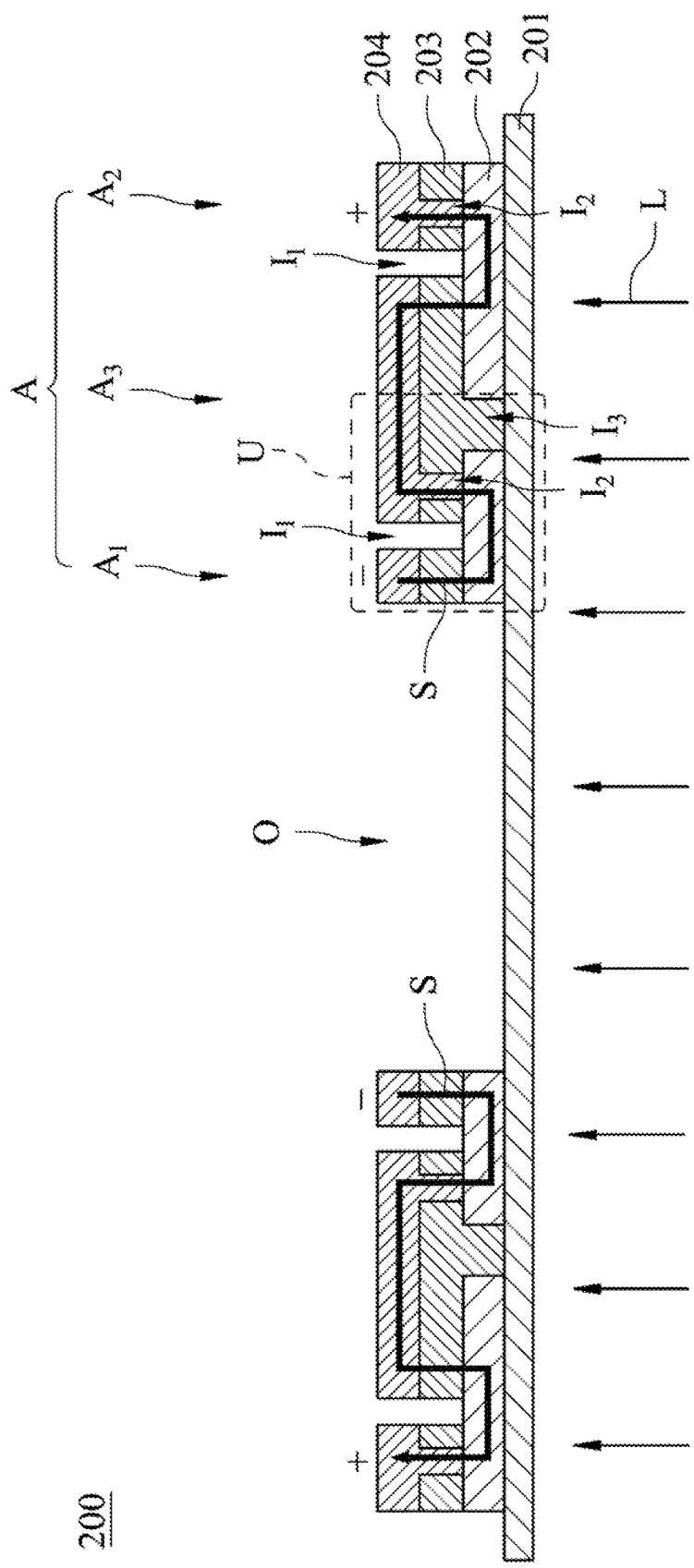
FIG. 6A is a section view showing a solar cell hollow circuit according to one embodiment of the present disclosure.
Figure 6B:
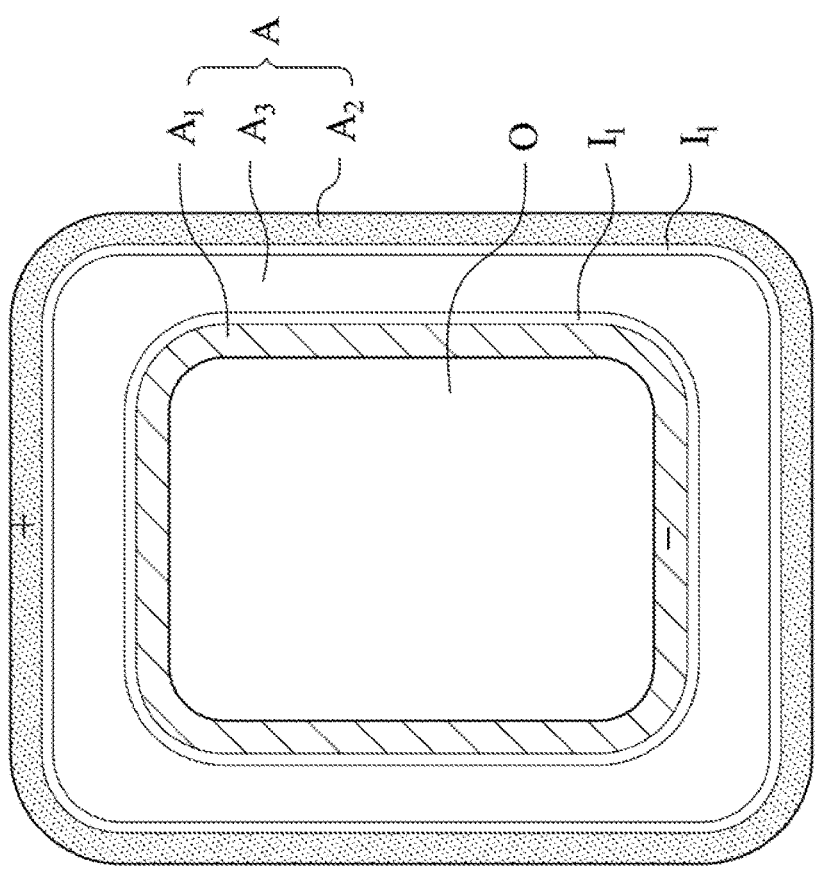
FIG. 6B is a top view of the solar cell hollow circuit of FIG. 6A.

FIG. 6A is a section view showing a solar cell hollow circuit 200 according to one embodiment of the present disclosure; FIG. 6B is a top view of the solar cell hollow circuit 200 of FIG. 6A. The solar cell hollow circuit 200 in FIG. 6A has a similar structure with those in FIG. 4A, the hollow surround area A is also formed on the substrate 201. In FIG. 6A, the solar cell hollow circuit 200 includes a plurality of first isolation areas $I_1$, a plurality of second isolation areas $I_2$ and a third isolation area $I_3$. The first isolation areas $I_1$ are formed on the first conductive layer 202 and each of the first isolation areas $I_1$ is through the photoelectric conversion layer 203 and the second conductive layer 204. The second isolation areas $I_2$ are formed on the conductive layer 202 and each of the second isolation area $I_2$ is through the photoelectric conversion layer 203. The second conductive layer 204 fills each of the second isolation areas $I_2$. The third isolation area $I_3$ is formed on the substrate, and the third isolation area $I_3$ is through the first conductive layer 202. The third isolation area $I_3$ is located between one of the first isolation areas ii and one of the second isolation areas $I_2$. In FIG. 6A, the hollow surround area A is isolated by each of the first isolation areas $I_1$ thereby forming a first surround area $A_1$ adjacent to the opening S, a second surround area $A_2$ away from the opening S and a third surround area $A_3$ located between the first surround area $A_1$ and the second surround area $A_2$. When the light L is incident to the photoelectric conversion layer 203, the inner circuit S is shown in FIG. 6A. In FIG. 6A, the solar cell hollow circuit 200 can be seen as a connection of a plurality of structural units U. Each of the structural units U includes a first isolation area $I_1$, a second isolation area $I_2$ and a third isolation area $I_3$. The structural units U is connected repeatedly, and through the third isolation area $I_3$, the positive (negative) contact of one of the structural units U is conducted with the negative (positive) contact of the adjacent structural units U, thereby forming a series connection of the inner circuit S.

Figure 7A:
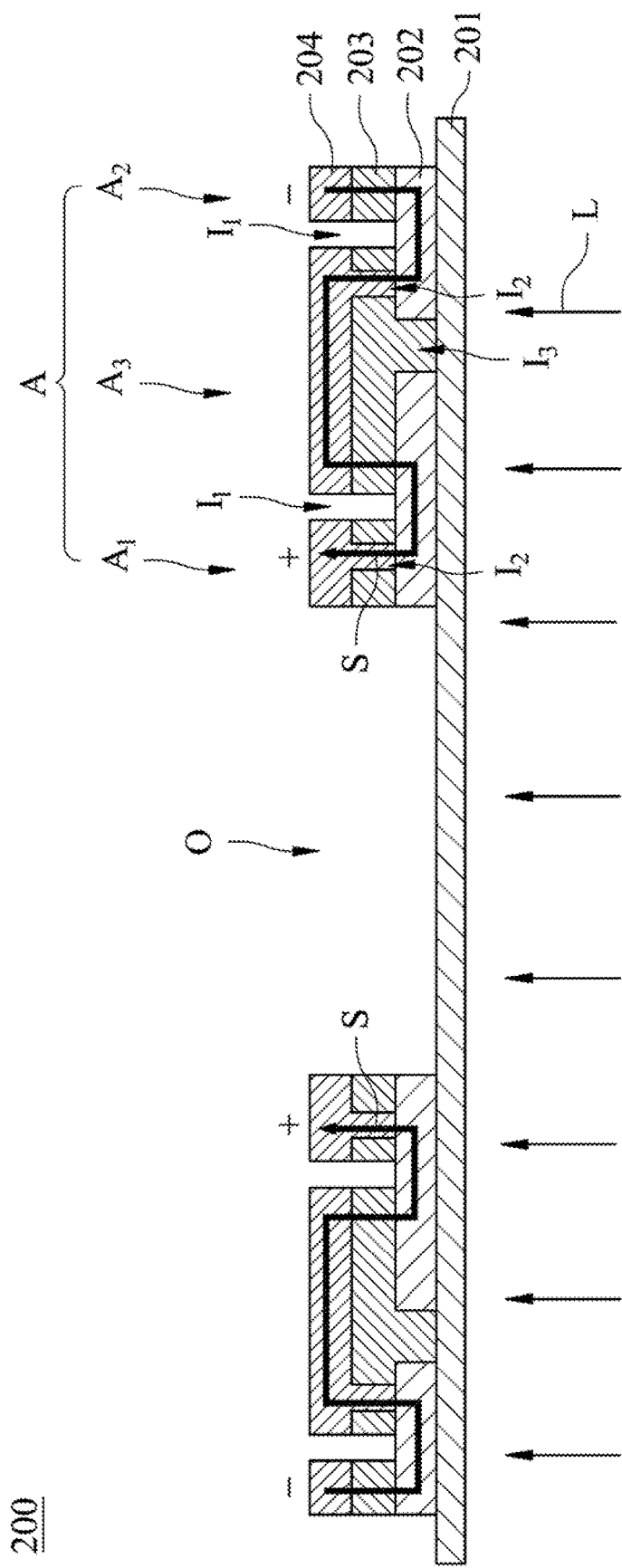
FIG. 7A is a section view showing a solar cell hollow circuit according to one embodiment of the present disclosure.
Figure 7B:
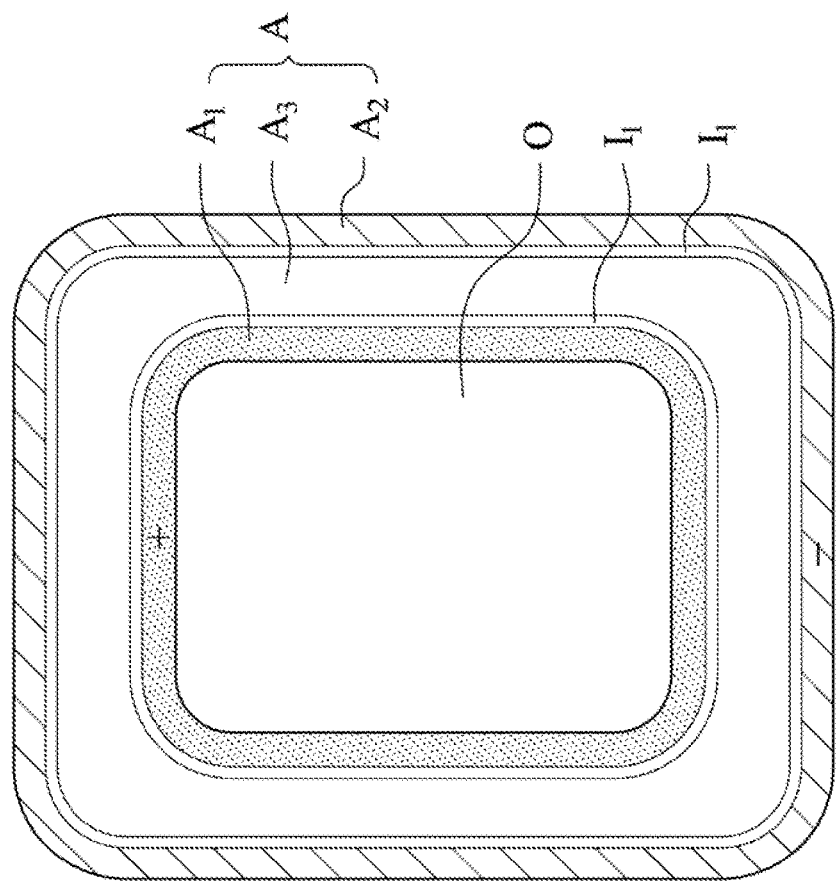
FIG. 7B is a top view of the solar cell hollow circuit of FIG. 7A.

FIG. 7A is a section view showing a solar cell hollow circuit 200 according to one embodiment of the present disclosure; FIG. 7B is a top view of the solar cell hollow circuit 200 of FIG. 7A. The solar cell hollow circuit 200 in FIGS. 7A and 7B has a similar structure with those in FIGS. 6A and 6B, but the positions of the first isolation areas $I_1$ and the second isolation areas $I_2$ are different. The third isolation area $I_3$ is also located between one of the first isolation area $I_1$ and one of the second isolation areas $I_2$. In FIG. 7A, owing to the different positions of the first isolation area $I_1$ and the second isolation area $I_2$, a reverse direction of the inner circuit S in FIG. 6A is generated. At the time, the first surround area $A_1$ adjacent to the opening O acts the positive contact and the second surround area $A_2$ away from the opening O acts the negative contact. The different arrangements of the positive contact and the negative contact are also shown in FIG. 7B.

Figure 8:
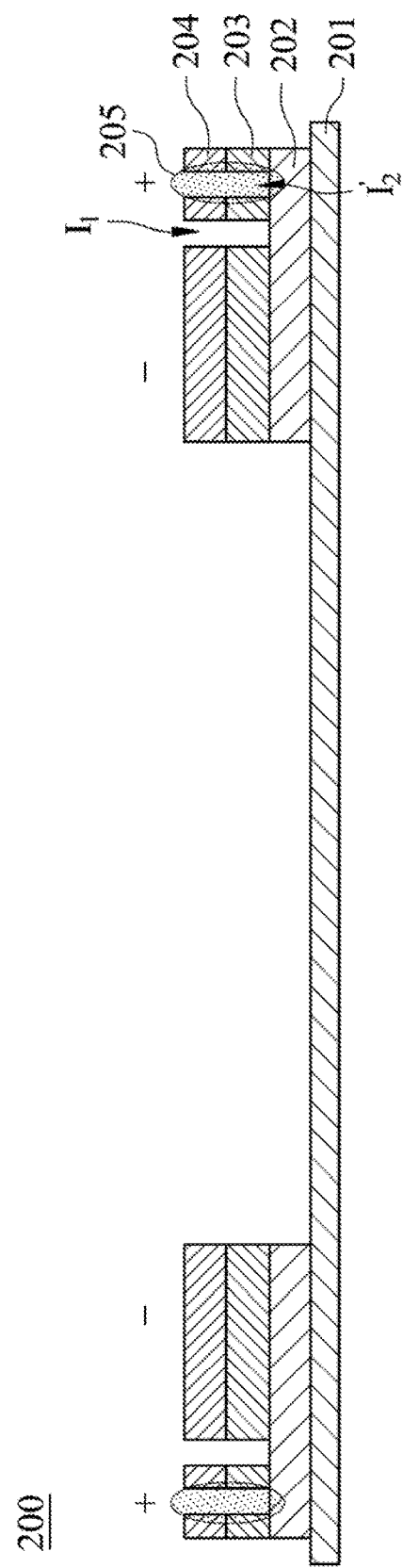
FIG. 8 is a schematic view showing a positive contact and a negative contact of a solar cell hollow circuit according to one embodiment of the present disclosure.

FIG. 8 is a schematic view showing a positive contact and a negative contact of a solar cell hollow circuit 200 according to one embodiment of the present disclosure. In the embodiment of FIG. 4, it has been demonstrated that the first surround area $A_1$ acts as the negative contact and the second surround area $A_2$ acts as the positive contact through the formation of the first isolation area $I_1$ and the second isolation area $I_2$. For simplifying the manufacturing process, another embodiment of the solar cell hollow circuit 200 is shown in FIG. 8. In one kind of manufacturing process, the photoelectric conversion layer 203 is formed first, and then the second isolation area $I_2$, the second conductive layer 204 and the first isolation area $I_1$ are formed in sequence. In general, the first isolation area $I_1$ and the second isolation area $I_2$ are formed by a laser scribing process, and the photoelectric conversion layer 203 and the second conductive layer 204 are formed by a film coating process. In order to avoid the inconvenience when crossly performing the laser scribing process and the film coating process, all of the film coating processes can be performed first then performing all of the laser scribing processes. For example, the photoelectric conversion layer 203 and the second conductive layer 204 are formed first by the film coating processes, and the first isolation area $I_1$ and a second isolation area $I_2'$ are formed in sequence; or the second isolation area $I_2'$ is formed and then forming the first isolation area $I_1$. At the time, since the first isolation area $I_1$ and the second isolation area 12' are all scribed through the photoelectric conversion layer 203 and the second conductive layer 204, the second isolation area $I_2'$ cannot act as the positive contact as the second isolation area $I_2$ in the aforementioned embodiments. For forming the positive contact, a conductive material 205 is filled in the second isolation area $I_2'$ by printing or any possible methods.

Figure 9:
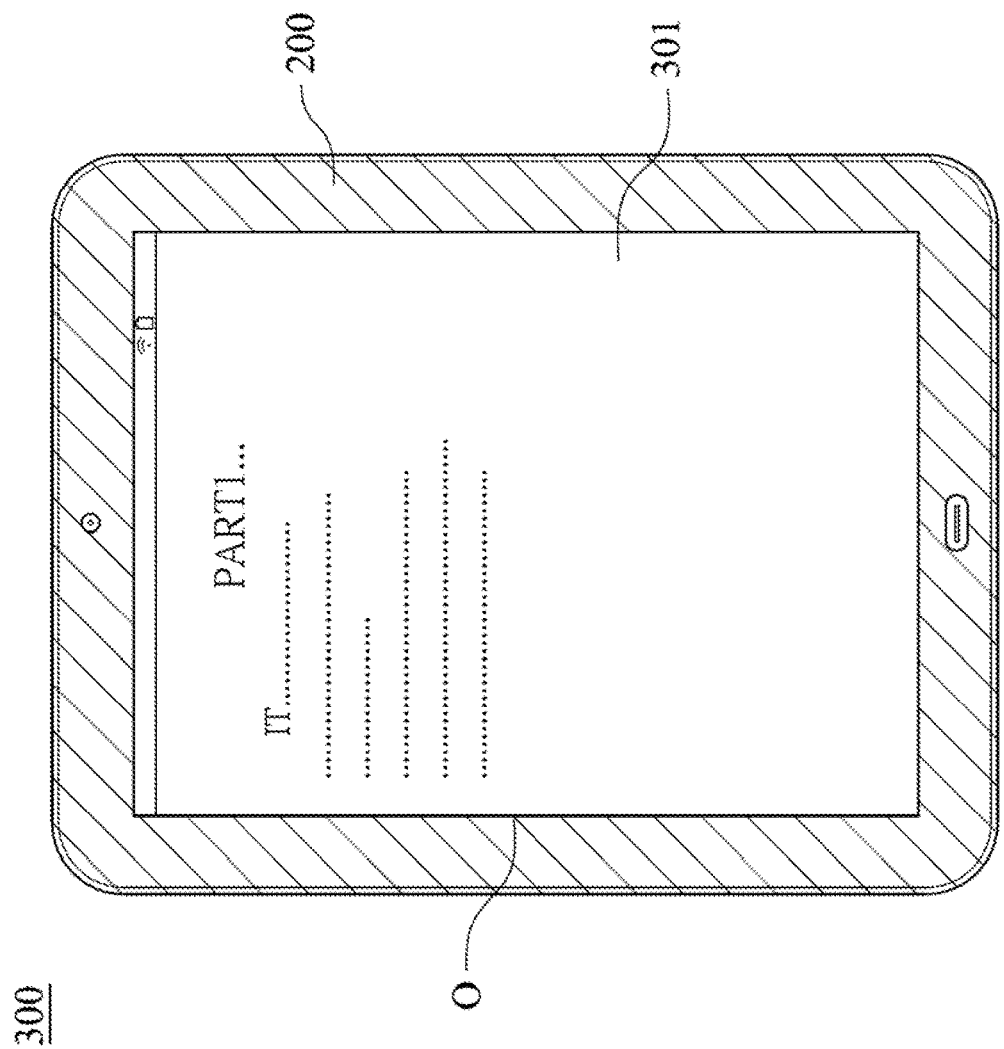
FIG. 9 is a schematic view of a solar cell display device according to one embodiment of the present disclosure.
Figure 10A:
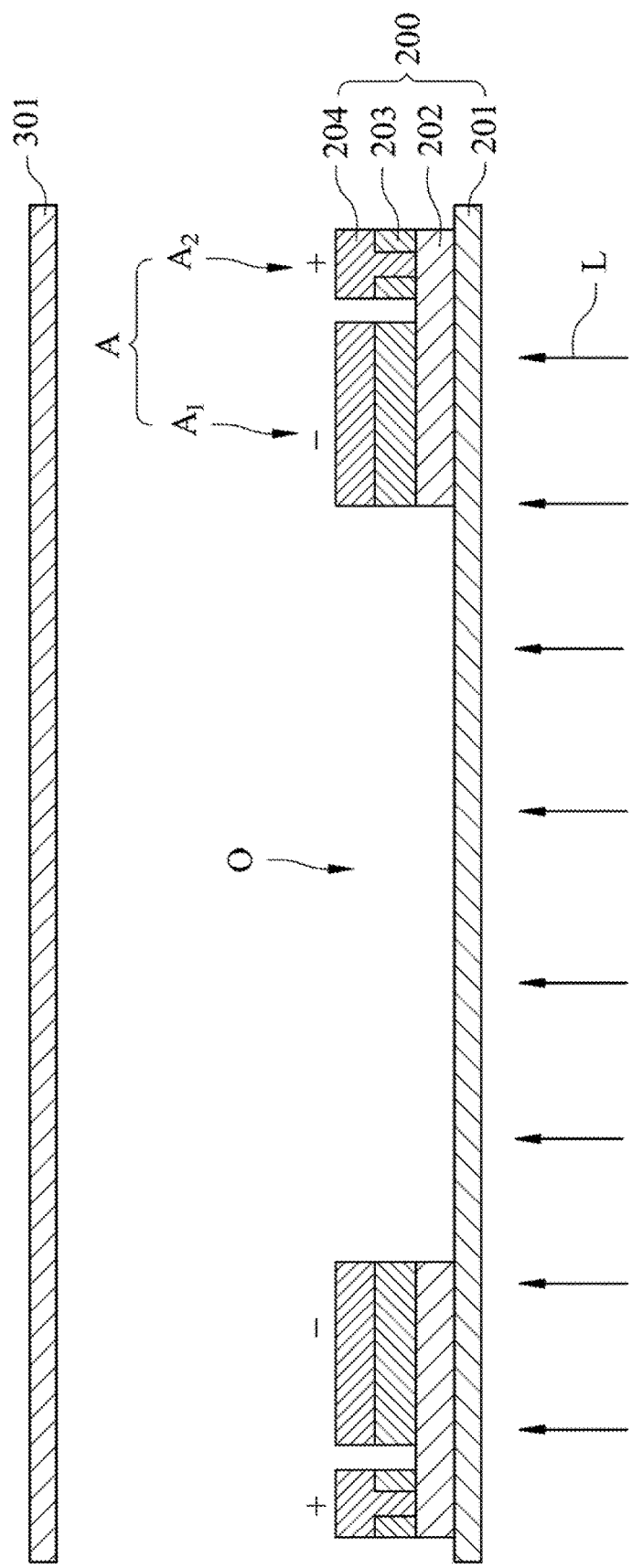
FIG. 10A is a section view showing the solar cell display device of FIG. 9 and a light is incident from a substrate.
Figure 10B:
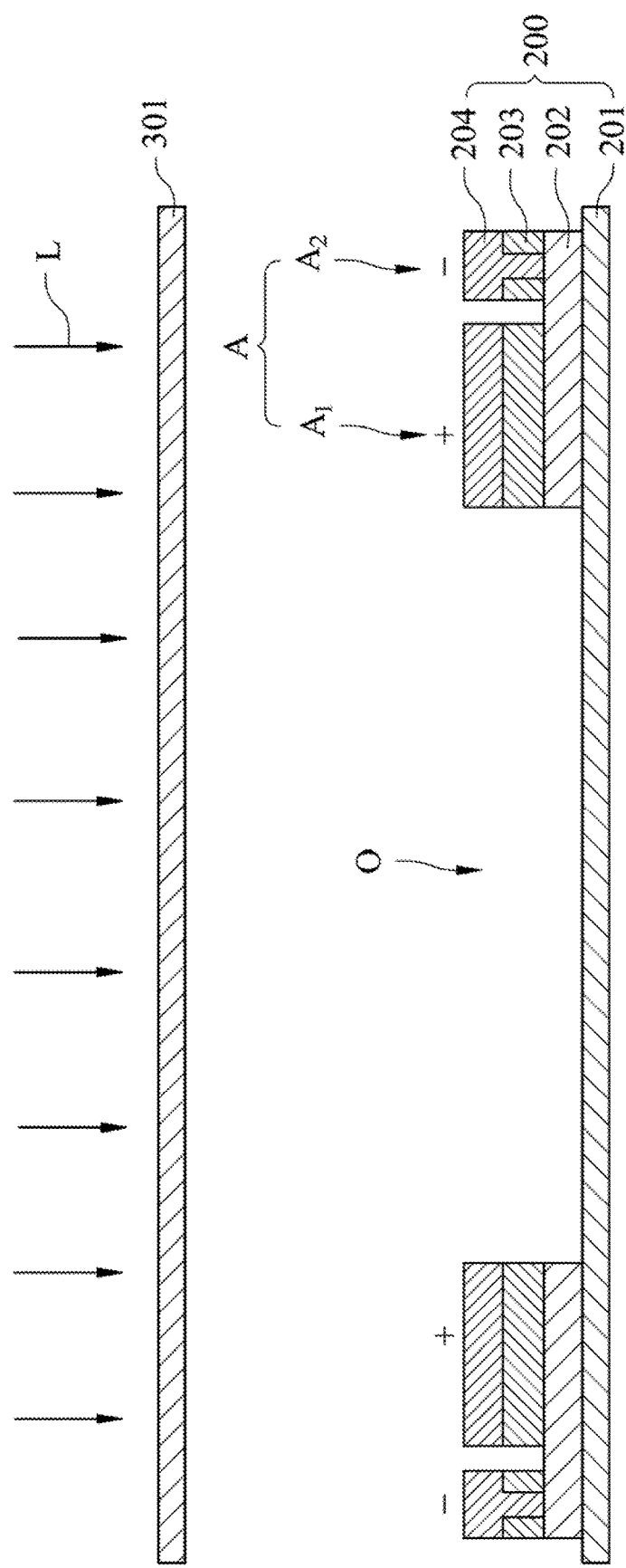
FIG. 10B is a section view showing the solar cell display device of FIG. 9 and a light is incident from a display panel.

FIG. 9 is a schematic view of a solar cell display device 300 according to one embodiment of the present disclosure; FIG. 10A is a section view showing the solar cell display device 300 of FIG. 9 and a light L is incident from a substrate 201; FIG. 10B is a section view showing the solar cell display device 300 of FIG. 9 and a light L is incident from a display panel 301. FIG. 9 shows an application of the solar cell hollow circuit 200, a solar cell display device 300 is formed by assembling the solar cell hollow circuit 200 with a display panel 301. The display panel 301 can be a touch panel or non-touch panel. In FIG. 9, a mobile e-reader is taken as an example. The display panel 301 is covered on the opening S located in the central position of the substrate 201 for displaying texts or images corresponding to the opening S. At the time, the hollow surround area A of the solar cell hollow circuit 200 is correspondingly located under the frame of the e-reader. Through the solar cell hollow circuit 200, it is possible to storage electric energy for providing the electricity to the display panel 301 and to read the messages simultaneously. In the solar cell hollow circuit 200 of the present disclosure, the path of the carrier in the first conductive layer 202 is short, thereby increasing the fill factor and the electricity extraction efficiency. Thus, it can provide enough electricity when the area of the hollow surround area A is only ⅛ of the area of the opening O. Therefore, the display panel 301 can use the larger area for display texts or images. Furthermore, through the arrangements of the first conductive layer 202 and the second conductive layer 204, the solar cell display device 300 can have wide applications. For example, the solar cell display device 300 can be easily integrated with an outer device without extra processes or increasing the volume thereof.

In the present disclosure, the first conductive layer 202 or the second conductive layer 204 can act as the positive contact or the negative contact in accordance with different situations. In FIG. 10A, the first conductive layer 202 selects a positive electrode material and the second conductive layer 204 selects a negative electrode material. Therefore, the first surround area $A_1$ adjacent to the opening O acts as the negative contact, and the second surround area $A_2$ away from the opening O acts as the positive contact. At the time, the light L is incident through the substrate 201 to the photoelectric conversion layer 203 for converting the light energy to the electric energy and generating the inner circuit S.

Another embodiment is shown in FIG. 10B. In FIG. 10B, the first conductive layer 202 selects a negative electrode material and the second conductive layer 204 selects a positive electrode material. Therefore, the first surround area $A_1$ adjacent to the opening O acts as the positive contact, and the second surround area $A_2$ away from the opening O acts as the negative contact. At the time, the light L is incident through the display panel 301 to the photoelectric conversion layer 203 for converting the light energy to the electric energy and generating the inner circuit S.

The positive contact, the negative contact and the incident direction of the light L can be adjusted for obtaining wider applications.

In sum, the solar cell hollow circuit 200 of the present disclosure can be easily assembled with the display panel 301 for constructing the solar cell display device 300. The solar cell display device 300 can have a wider viewable area and more connection flexibility owing to the arrangements of the positive contact and the negative contact.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A solar cell hollow circuit, comprising:
    a substrate;
    a first conductive layer formed on the substrate;
    a photoelectric conversion layer formed on the first conductive layer; and
    a second conductive layer formed on the photoelectric conversion layer;
    wherein a hollow surround area is formed on the substrate by the first conductive layer, the photoelectric conversion layer and the second conductive layer, the hollow surround area defines an opening, and the hollow surround area defines a positive contact or a negative contact corresponding to the opening;
    wherein a first isolation area is formed on the first conductive layer, and the first isolation area is through the photoelectric conversion layer and the second conductive layer;
    wherein the hollow surround area is isolated by the first isolation area thereby forming a first surround area adjacent to the opening and a second surround area away from the opening.

2. The solar cell hollow circuit of claim 1, wherein a material of the first conductive layer comprises a TCO, a metal or a combination thereof, and a material of the second conductive layer comprises a TCO, a metal or a combination thereof.

3. The solar cell hollow circuit of claim 1, wherein a material of the photoelectric conversion layer comprises single crystal silicon, amorphous silicon (a-Si), micro-crystal silicon (uc-Si), amorphous Silicon-Germanium (a-SiGe), amorphous silicon oxide (a-SiO), amorphous silicon carbide (a-SiC), CuInGaSe, CdTe, DSSC or organic compound.

4. The solar cell hollow circuit of claim 1, wherein a second isolation area is formed on the first conductive layer, the second isolation area is through the photoelectric conversion layer, and the second conductive layer fills the second isolation area.

5. The solar cell hollow circuit of claim 1, wherein the first surround area acts as the positive contact and the second surround area acts as the negative contact.

6. The solar cell hollow circuit of claim 1, wherein the first surround area acts as the negative contact and the second surround area acts as the positive contact.

7. The solar cell hollow circuit of claim 1, wherein a plurality of first isolation areas and a plurality of second isolation areas are formed on the first conductive layer, a third isolation area is formed on the substrate, each of the first isolation areas is through the photoelectric conversion layer and the second conductive layer, each of the second isolation areas is through the photoelectric conversion layer, the second conductive layer fills the second isolation area, the third isolation layer is through the first conductive layer, and the third isolation layer is located between one of the second isolation areas and one of the first isolation areas.

8. The solar cell hollow circuit of claim 7, wherein the hollow surround area is isolated by each of the first isolation areas thereby forming a first surround area adjacent to the opening, a second surround area away from the opening and a third surround area located between the first surround area and the second surround area.

9. The solar cell hollow circuit of claim 8, wherein the first surround area acts as the positive contact and the second surround area acts as the negative contact.

10. The solar cell hollow circuit of claim 8, wherein the first surround area acts as the negative contact and the second surround area acts as the positive contact.

11. A solar cell display device, comprising:
    a substrate;
    a first conductive layer formed on the substrate;
    a photoelectric conversion layer formed on the first conductive layer;
    a second conductive layer formed on the photoelectric conversion layer, wherein a hollow surround area is formed on the substrate by the first conductive layer, the photoelectric conversion layer and the second conductive layer, and the hollow surround area defines an opening in a central position of the substrate; and
    a display panel covered on the opening and displaying texts or images on a position corresponding to the opening;
    wherein a first isolation area is formed on the first conductive layer, and the first isolation area is through the photoelectric conversion layer and the second conductive layer;
    wherein the hollow surround area is isolated by the first isolation area thereby forming a first surround area adjacent to the opening and a second surround area away from the opening.

12. The solar cell display device of claim 11, wherein the display panel is a touch panel or non-touch panel.

13. The solar cell display device of claim 11, wherein an area of the hollow surround area is ⅛ of an area of the opening.

14. The solar cell display device of claim 11, wherein the hollow surround area defines a positive contact or a negative contact corresponding to the opening.

* * * * *